United States Patent [19]
Sadler et al.

[11] Patent Number: 5,763,870
[45] Date of Patent: Jun. 9, 1998

[54] METHOD AND SYSTEM FOR OPERATING A LASER DEVICE EMPLOYING AN INTEGRAL POWER-REGULATION SENSOR

[75] Inventors: John W. Sadler, Belmont; Andreas N. Dorsel, Menlo Park; J. Robert Mitchell, San Francisco; Mark A. Troll, Palo Alto, all of Calif.

[73] Assignee: Hewlett-Packard Company, Palo Alto, Calif.

[21] Appl. No.: 764,910

[22] Filed: Dec. 13, 1996

[51] Int. Cl.$^6$ .................................. G02B 5/30; G11B 7/00
[52] U.S. Cl. .................... 250/201.2; 250/225; 250/205; 250/559.22
[58] Field of Search ................. 250/201.2, 225.205, 250/559.22, 548; 356/399–401

[56] References Cited

U.S. PATENT DOCUMENTS

| | | | |
|---|---|---|---|
| 4,291,223 | 9/1981 | Sakane et al. | 250/201 |
| 4,577,320 | 3/1986 | Yoshikawa et al. | 372/29 |
| 4,689,480 | 8/1987 | Stern | 250/201 |
| 4,990,771 | 2/1991 | Minoura et al. | 250/236 |
| 5,218,461 | 6/1993 | Aoyama et al. | 358/471 |
| 5,283,681 | 2/1994 | Hoshino et al. | 359/198 |
| 5,296,703 | 3/1994 | Tsien | 250/235 |
| 5,323,026 | 6/1994 | Paoli | 257/85 |
| 5,376,804 | 12/1994 | Coleman | 250/548 |
| 5,646,778 | 7/1997 | Shuman | 250/225 |

*Primary Examiner*—Stephone B. Allen

[57] ABSTRACT

A method and system of operating a laser device includes utilizing an integral power-regulation sensor of the laser device to detect energy back reflected from an object of interest and then using the detected signal as a basis for determining a characteristic related to the object of interest. In the preferred embodiment, the determined characteristic is the position of the beam focus relative to a surface of the object. Also in the preferred embodiment, the integral power-regulation sensor is disconnected from power-regulation circuitry during the focusing operation. Interaction of the back reflected energy and the outgoing beam can be reduced by introducing beam rotation, such as by providing a quarter-wave plate along the beam path. Focusing sensitivity can be increased by locating reflective targets over the surface and by executing AC measurements to filter DC components from the signal.

21 Claims, 3 Drawing Sheets

METHOD AND SYSTEM FOR OPERATING A LASER DEVICE EMPLOYING AN INTEGRAL POWER-REGULATION SENSOR

TECHNICAL FIELD

The invention relates generally to methods of operating a laser device and more particularly to methods and systems for acquiring data, such as focus information, relating to interaction of a laser output beam and an object impinged by the beam.

BACKGROUND ART

Lasers are used in a wide variety of applications in various fields. For example, an output beam may be scanned along the surface of a semiconductor wafer to detect particles prior to fabrication of integrated circuits on the semiconductor wafers. The output beam is scanned across the wafer surface and a detector is positioned to receive reflected or scattered beam energy. The beam energy received at the detector will vary depending upon the presence or absence of a particle along the axis of the beam.

Another example of a laser application is analyzing biological samples. U.S. Pat. No. 5,376,804 to Coleman describes an optical analysis system for use in forming an image of microscopic spot samples on a substrate. The samples are labeled with a fluorescent dye which affects the polarization plane of an incident beam. The microspots may be a few tenths of micrometers in diameter. In addition to the microspots, the substrate includes a focusing pattern. The focusing pattern is used to align a number of locations on the substrate with a focus of an optical test or processing arrangement. It is critical that the narrow beam is focused on a point location on the surface of the substrate carrying the microspots.

A related invention is described in U.S. Pat. No. 5,296,703 to Tsien. Tsien describes a scanning confocal microscope for fluorescence detection. An incident beam is scanned along a sample and the resulting fluorescence radiation is detected to form an image of the sample. The optical path of the laser includes a primary dichroic mirror. A portion of the radiation that impinges the sample retraces the path of the incident beam to the dichroic mirror. The dichroic mirror separates the reflected fluorescence beam from the incident beam, so that a properly positioned detector can be used to determine the intensity of the reflected fluorescence beam and can generate a corresponding scanned signal.

For laser-excited fluorescence scanning imaging systems, the laser beam is typically focused into a microspot on the surface to be imaged. Imaging optics are configured to provide depth discrimination on a scale of a few spot diameters in order to accept fluorescence from the focal plane in preference to scattered light or fluorescence that is outside of the focal plane. If the surface is not in the focal plane, the spot is not illuminated as strongly and any light that is emitted is largely rejected by the depth discrimination characteristics of the optics. Moreover, the best image contrast occurs at the point of best focus. For systems such as those described in the Coleman patent, the system must be refocused each time that the sample substrate is changed. The substrates may be changed within frames, and each substrate will be mounted slightly differently than others.

While the mounting variations among the sample substrates are slight, the required exacting focus tolerances cause the differences to be significant to the operation of the imaging system. As noted in the Tsien patent, focusing may be achieved by introducing an optical element that directs reflected energy to a photodetector assembly. The photodetector assembly may consist of a photodiode and amplifier, a diffuser, a pinhole, and possibly a lens. The optical element may be a beam splitter which is interposed in the beam path between the laser and the scanning optics. Focusing in this manner requires that the surface that is scanned be reflective. Reflectivity can be accomplished either by covering a portion of the scanned surface with a reflective material, such as chromium, or by taking advantage of the reflection at the interface of two materials having significantly different indices of refraction, e.g., glass and air. The intensity of the reflected light at the externally introduced sensor is monitored while moving the substrate or the focusing lens. At the point of best focus, the reflected light follows exactly the reverse path of the incident beam, assuming either a telecentric scan lens or that the scanning is accomplished by moving the spot relative to the target in the plane of the target surface. At this point of best focus, the reflected light beam has substantially the same diameter as the incident beam before the focusing optics. On the other hand, away from the best focus, the diameter of the reflected beam is larger. The photodetector assembly will register a maximum when the beam is narrowest, since the pinhole passes more energy in such a situation.

In order to accommodate the refocusing of a laser-excited fluorescence scanning imaging system on a substrate-by-substrate basis, such systems typically include at least two optical arrangements for detection of optical emission from the substrates. The first optical arrangement is the one that is employed to achieve the substrate-specific focusing. This first optical arrangement conventionally employs reflective focus techniques in which regions of the substrate other than the fluorescent tags are illuminated, since illuminating the fluorescent tags tends to bleach the tags, rendering the subsequent data extraction less reliable. The second optical arrangement for fluorescence detection is the one that is used to form the final image. Typically, there is a third detection arrangement, but this arrangement is not used in the detection of fluorescence emission. This third arrangement regulates the output power of the laser beam. For different reasons, such as fluctuations in temperature, beam power will vary during operation of a laser. Many lasers incorporate a power servo system that monitors emitted optical power and regulates beam current to the optical power at a given setpoint. Thus, the structure of the power sensor and the connected circuitry are optimized for detecting the strength of the emerging beam.

For gas lasers, the power sensors are mounted internally and a beam splitter redirects a portion of the output beam energy to the power sensor, which may be a photodiode. For semiconductor lasers, the power sensor may be formed on the same substrate as the semiconductor layers that define the laser device. U.S. Pat. Nos. 5,323,026 to Paoli and 4,577,320 to Yoshikawa et al. describe semiconductor lasers having substrate-formed power sensors that are used to regulate output power.

For both the gas and semiconductor lasers, the power sensors are connected to current-regulating circuitry that varies the supply current to the laser and responds to changes in output power.

The various imaging systems operate well for their intended purposes, but the need of separate optical detection arrangements for focusing and for imaging an object of interest causes the cost of the system to be relatively high. While the cost and labor concerns related to operation of laser devices and laser-related systems have been described with reference to imaging systems, the concerns apply to other applications in which laser detection is relevant.

What is needed is a method and system of operating a laser device to reduce the cost and/or labor intensity of the overall system in which the laser device is utilized.

SUMMARY OF THE INVENTION

A method and system for operating a laser device includes shifting the purpose of a power-regulation sensor of the laser device. Rather than merely using the sensor in a manner to sense and regulate the output power of an emerging beam from the laser device, the sensor is also temporarily used to determine a characteristic related to an object of interest. The output beam from the laser device is directed at the object of interest and the power-regulation sensor is employed to detect energy reflected from the object. The sensor forms a signal indicative of the detected reflected energy. Based upon the signal, the object-related characteristic is determined. In the preferred embodiment, the sensor is used to determine beam focusing characteristics.

The object of interest may be a substrate having an array of fluorescently tagged biological samples, such as fluorescently tagged molecules. The power-regulation sensor is fixed to the laser device to sample a portion of the output beam. Consequently, any laser light that is reflected from the substrate along the path of the output beam will be sampled by the same power-regulation sensor. In the preferred embodiment, the sensor is disconnected from regulation circuitry. By disabling the sensor with respect to its original function, the sensor output may be optimized for focus detection.

The polarization of the energy reflected to the laser device is preferably rotated in order to reduce any interaction between the output beam and the incoming reflected energy. For example, a quarter-wave plate oriented at 45 degrees relative to the polarization of the incident beam will, upon being passed by both the incident and back reflected beams, act as a half-wave plate to rotate the polarization by 90 degrees.

For applications in which the object of interest is a sample substrate (i.e., a chip) having an array of fluorescently tagged biological molecules, a focusing operation is executed each time that the sample substrate is changed. A "focal plane" is desired, so that multiple focal points are detected and the position of the surface of the substrate is shifted to include all of the detected focal points. Two-dimensional imaging of the surface may be achieved by raster scanning the output beam across the surface, fixing the sample substrate to a mount that can be translated in both X and Y directions, or by scanning the beam in one direction and periodically shifting the position of the substrate in the direction perpendicular to the scan direction.

In one embodiment, focus detection includes directing the output beam at the substrate and then moving a focusing mechanism (e.g., an optical element) through its entire range. During the movement through the range, the output beam may be dithered (i.e., moved in oscillating fashion) at such a rate that numerous dithering cycles are completed over the focus travel. The power-regulation sensor that is integral with the laser device is used to generate a signal indicative of measured intensity of reflected energy through the range of focus. The resulting intensity curve is then used to identify the focus.

Sensitivity and contrast are enhanced in the preferred embodiment by attaching a number of reflective targets to the sample substrate or other object of interest. For example, chrome targets may be located on the scanned surface. Sensitivity is further improved by an AC measurement that includes dithering the laser beam on and off a reflective target. Differencing the sample amplitudes from on and off the reflective target rejects any DC components of the emergent laser beam, so that output power regulation is less important. Since the power regulation servo system is disabled in the preferred embodiment, this feature is significant. The AC measurement renders the focus procedure less sensitive to longer term variations in beam intensity caused by the dynamics of the laser device itself.

An advantage of the invention is that the focusing procedure may be implemented without requiring the overall system to include an optical detection arrangement specifically added for achieving focusing. That is, rather than having a first optical detection arrangement for the final imaging and a second optical detection arrangement for focusing, the invention utilizes the previously included power-regulation sensor for focusing. This reduces the cost of the system. Another advantage of the invention is that the system setup is less complex. Conventional focus detection arrangements require separate alignment steps. On the other hand, the integral power-regulation sensor or its beam-redirecting optical element is permanently fixed in an appropriate position. Consequently, only the final imaging detector arrangement needs alignment.

Another advantage is that the use of the reflective targets and the AC measurement technique improve sensitivity to the focus signal, decrease sensitivity to fluctuations in beam power over a longer time scale than the dither period, and decrease sensitivity to the position of the focus target, since it is possible to servo-control the dithered beam to the center of a reflective target. The reflective targets may be located anywhere in the swath of a scanning beam, and the focus signal will still be satisfactory so long as the swath crosses at least one edge of the reflected target.

BEST MODE FOR CARRYING OUT THE INVENTION

Figure 1:
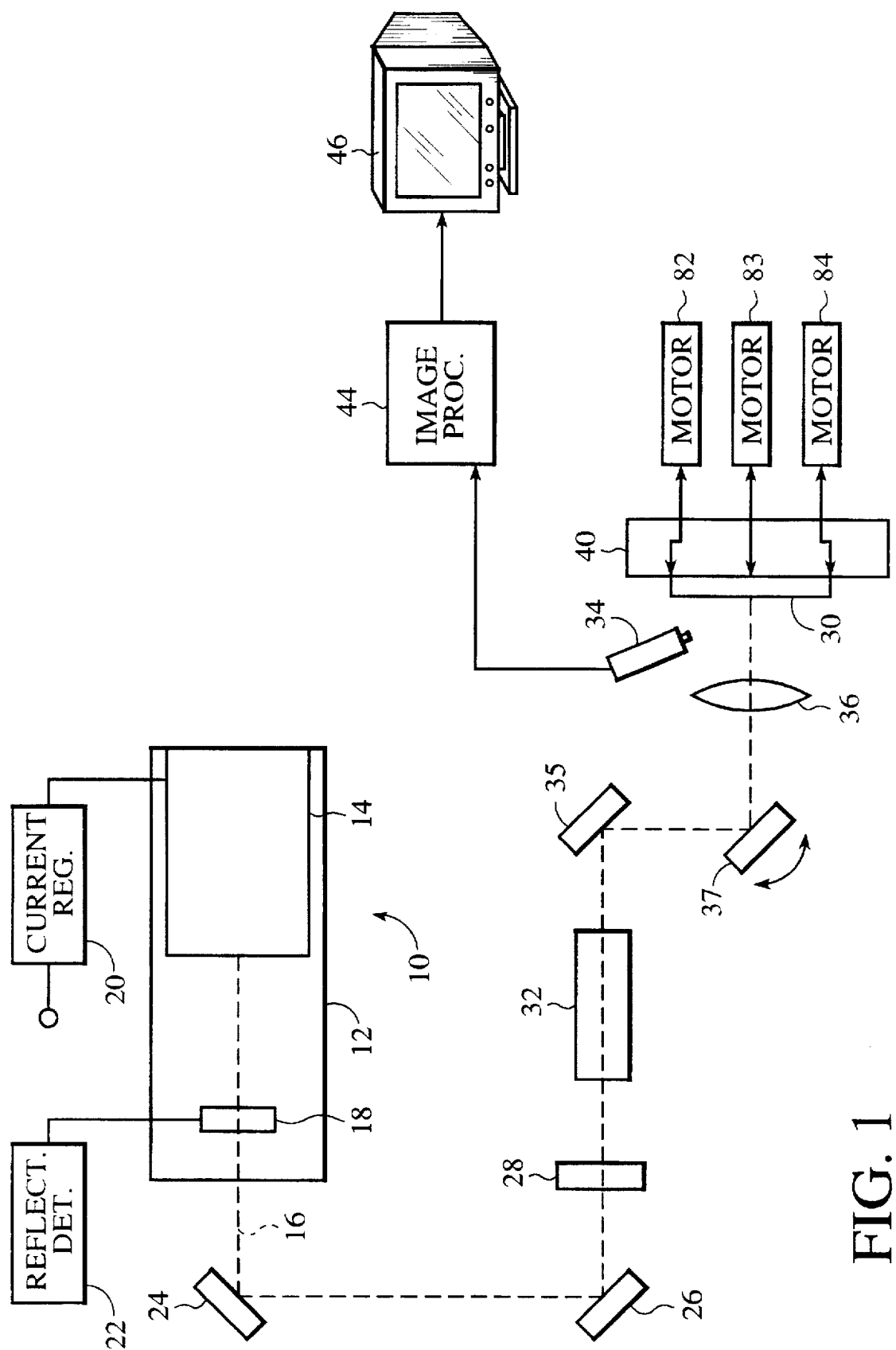
FIG. 1 is a block diagram of a scanning imaging system, such as an imaging system for fluorescently tagged biological molecules, in which an internal power sensor is used to detect back reflection in accordance with the invention.

With reference to FIG. 1, a conventional laser device 10 includes a housing 12 having a laser portion 124 that generates an output beam 16 that emerges from the housing. The laser device is a gas laser, such as a He—Ne device, but this is not critical. Alternatively, the laser may be a semiconductor laser.

Known laser devices 10 include internal power sensors 18.

While the internal power sensor is shown as being along the axis of the output beam, typically the laser includes one or more optical devices (e.g., a beam splitter) that redirect a portion of the output beam to an off-axis internal power sensor.

The internal power sensor is utilized to generate a signal for regulating input laser current. The power sensor detects output characteristics of the laser device and is conventionally connected to a current regulation circuit 20. However, in the invention of FIG. 1, the power sensor 18 is at least temporarily disabled with respect to current regulation. The internal power sensor is instead connected to a detector circuit 22 for measuring the received combination of outgoing and back reflected power, as will be explained more fully below.

The current regulation circuit 20 is shown as being external to the housing 12 of the laser device 10. In many applications, the current regulation circuit is contained within the housing. In like manner, the detector circuit 22 of the invention may be housed within the laser device. The internal connections often increase the signal-to-noise ratio from the internal power sensor 18. The power sensor may be a photo-diode, but other devices for generating an electrical signal in response to received light energy may be substituted.

In the embodiment of FIG. 1, the output beam 16 is redirected by a pair of mirrors 24 and 26. The use of the mirrors is not critical to the invention. Thus, a linear beam path may be employed without diverging from the invention. In the preferred embodiment, the optical path of the output beam passes through a quarter-wave plate 28 which is oriented at 45 degrees relative to the polarization of the incident beam. Since the quarter-wave plate is positioned to pass both the output beam and the back reflected beam, the quarter-wave plate acts as a half-wave plate to establish a 90 degree rotation of the back reflected beam relative to the output beam. The resulting polarization reduces the interaction between the emerging beam and the incoming back reflected beam to the laser device 10.

After the output beam 16 is redirected by the mirror 26 and passed through the quarter-wave plate 28, the beam reaches an optical element 32, such as a telescope. The structure and the operation of any optical focusing mechanism are not significant to the invention, and in fact are not necessary since focusing can be achieved by mechanical adjustments. In the area of fluorescence detection for biological molecules, the focusing can be implemented in a manner that provides a high level of precision and reliability. For laser-excited fluorescence scanners, the laser beam is typically focused into a microspot, e.g. 1–100 µm, onto the surface of the substrate 30. Imaging optics, such as a detector 34 are configured in such a way as to provide depth discrimination on a scale of a few microspot diameters. Thus, fluorescence from the focal plane of the substrate is accepted in preference to scattered light or fluorescence emission outside of the focal plane. If the surface is not in the focal plane, the substrate surface will not be illuminated as strongly, and light that is reflected from the substrate surface will be largely rejected by the depth discrimination characteristic of the detection optics.

A fixed mirror 35 redirects the output beam 16 to a scanning mirror 37 and a scanning lens 36, which sweep the output beam 16 as it approaches the surface of the substrate 30. The combination of a scanning mirror 37 and a scanning lens 36 to sweep the output beam is well known in the art, but is not critical to the invention. Motors 82, 83 and 84 are independently manipulated to position the substrate such that it lies along a focal plane of the scanning output beam. While not clearly shown in the two-dimensional drawing of FIG. 1, the three motors are connected to vary pitch and roll of the substrate 30, as well as the distance of the substrate from the scanning lens 36. When the substrate is properly positioned by manipulation of the motors 82, 83 and 84, the surface of the substrate lies along the focal plane of the scanning output beam throughout the range of movement of the substrate perpendicular to the scan direction.

The substrate 30 is connected to a mount 40 that is moved in a direction perpendicular to the beam sweep. As a result, the entire surface of the substrate 30 may be systematically illuminated. However, the invention may be utilized with systems which do not include a combination of beam scanning and substrate movement. The beam may be fixed, with the substrate being moved in both the X and Y directions. Alternatively, the scanning mechanism may be one that allows raster scanning, so that the substrate 30 may have a fixed location. While not preferred, the invention may also be used in applications in which neither the output beam nor the substrate is moved.

The imaging system of FIG. 1 includes conventional imaging components. Because the imaging components are not significant in the implementation of the invention, the imaging components have been simplified. Since fluorescent energy is dispersed in all directions, the detector 34 may be positioned off-axis of the beam to receive the fluorescent energy directly from the substrate surface. Preferably, the detector 34 includes spectral filtering, imaging apertures, a multi element lens assembly, and a photomultiplier tube (PMT), but this is not critical.

The detector generates a corresponding electrical signal that is conducted to image processing circuitry 44. The output of the processing circuitry forms an image at a monitor 46. However, other signal processing operations may be formed as a substitute for the image processing or in combination with the image processing.

Figure 2:
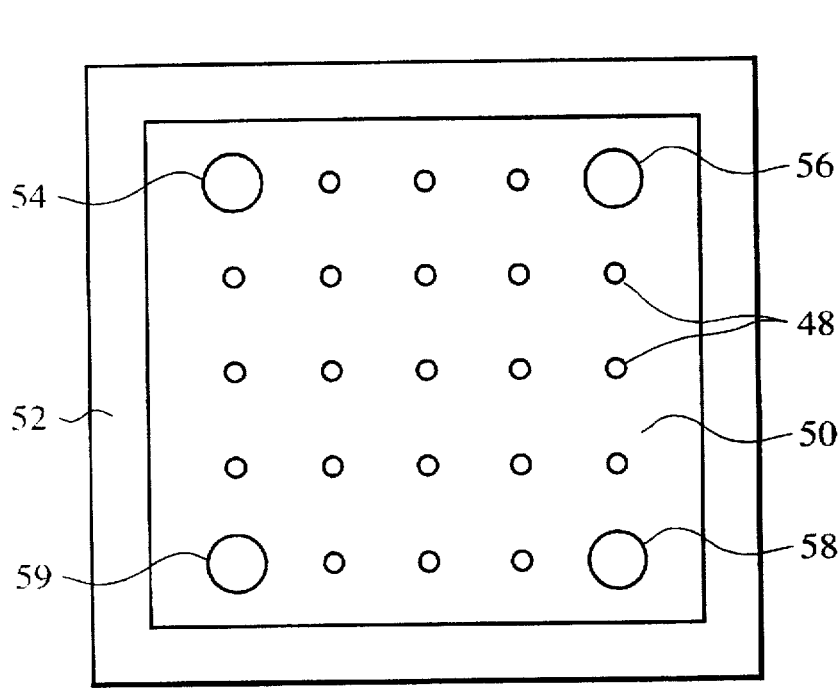
FIG. 2 is a front view of a sample substrate of FIG. 1.

FIG. 2 illustrates an exemplary substrate 30 that is to be scanned. The substrate and its fluorescently tagged molecules 48 are not shown to scale. The molecules are arranged in an array, as is known in the art. The focusing of the output beam on a planar surface 50 held within a frame 52 provides a high detection sensitivity. The detection is capable of discriminating between surface-bound molecules and free molecules within solution. Known laser confocal fluorescence microscopy achieves desired results.

In addition to the fluorescently tagged molecules 48, the surface 50 of the substrate 30 includes reflective targets 54, 56, 58 and 59. The targets may be made of chromium, but other materials may be used. The reflective targets are employed in the focusing procedure to be described immediately below.

Figure 3:
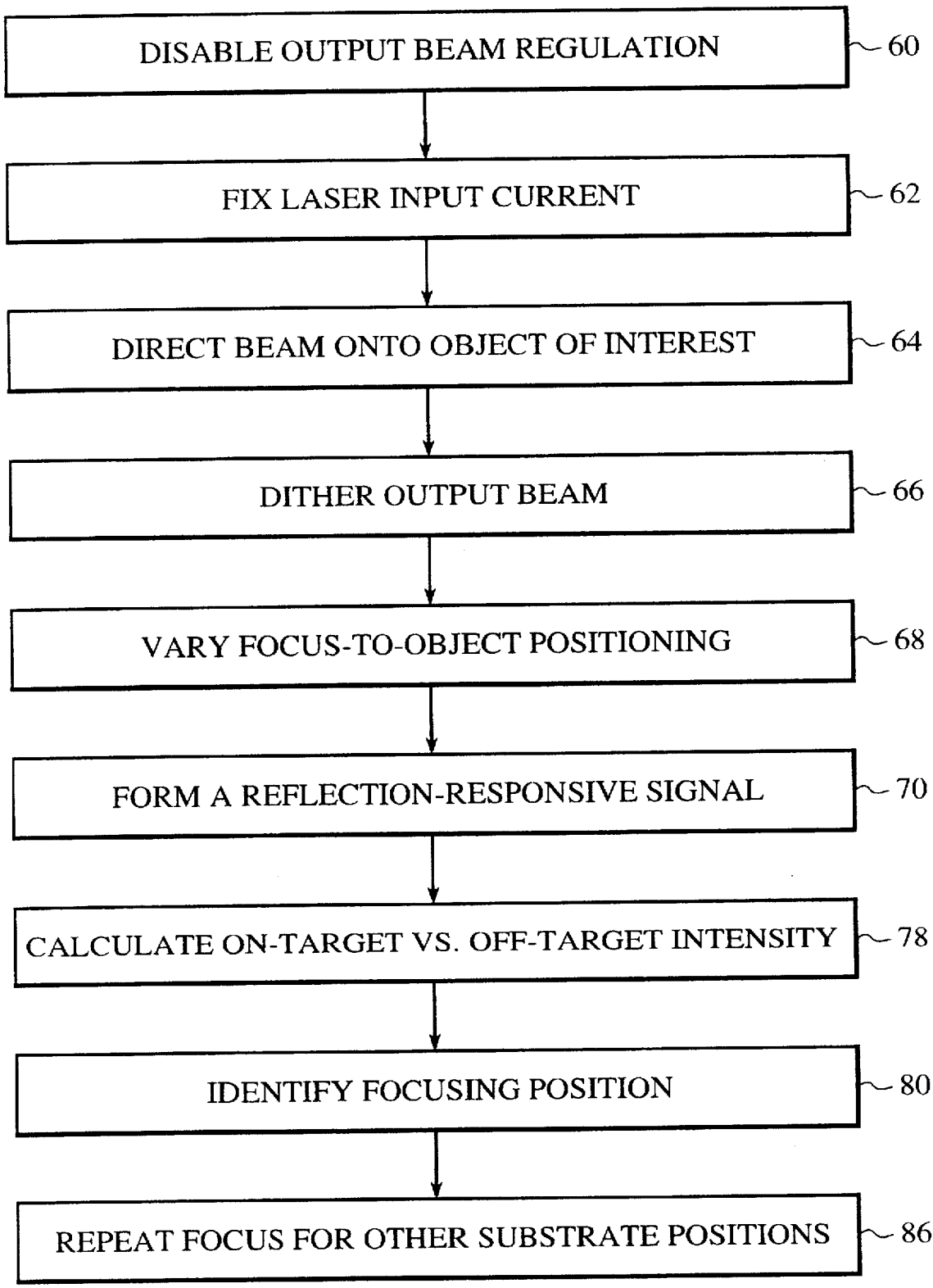
FIG. 3 is a flow process of a method of operating the laser device of FIG. 1.

The operation of the imaging system of FIG. 1 will be described with reference to FIG. 3. In a first step 60, the regulation of the output beam is disabled. That is, the internal power sensor 18 is disconnected from the current regulation circuit 20. The current regulation circuit 20 may then be programmed to provide a constant current, as shown at step 62. Preferably, the detector circuit 22 includes an AC measurement that reduces the susceptibility of the focusing operation to fluctuations in output beam, but DC measurement schemes may also be utilized. Optionally, once the focusing operation is completed, the power sensor 18 may be reconnected to the current regulation circuit 20. That is, the detector output may be used to provide two separate capabilities.

The output beam 16 is then directed onto the object of interest, as shown at step 64. In the imaging system of FIG. 1, the object of interest is the surface of the substrate 30. Impinging the surface causes back reflected energy to follow the same path as the output beam. The reflected energy re-enters the housing 12 of the laser device 10, but is rotated 90 degrees by the double passage through the quarter-wave plate 28. The resulting polarization reduces the interaction between the outgoing beam and the incoming energy. The incoming energy is detected by the internal power sensor 18 and a corresponding electrical signal is generated for input to the detector circuit 22.

The sensitivity of the focusing operation is improved in two manners. Firstly, referring again to FIG. 2, the reflective targets 54, 56, 58 and 59 are included to increase the level of back reflection during the focusing operation. Secondly, AC measurements are executed by dithering the laser output beam on and off a reflective target. The dithering step 66 is shown in FIG. 3. By differencing the signal amplitudes from on and off the reflective target, DC components of the emergent beam can easily be rejected by signal processing. The resulting measurement is less sensitive to long term variations in beam intensity caused by the dynamics of the laser device 10.

In step 68, the focus-to-object positioning is varied. In the embodiment of FIG. 1, the step may be implemented by using the scanning mirror 37 and the scanning lens 36 to sweep the output beam 16, while dithering the output beam over a focus target at such a rate that numerous dithering cycles are completed over the focus travel. For example, 1,000 dither cycles may be completed during the focus travel.

Figure 4:
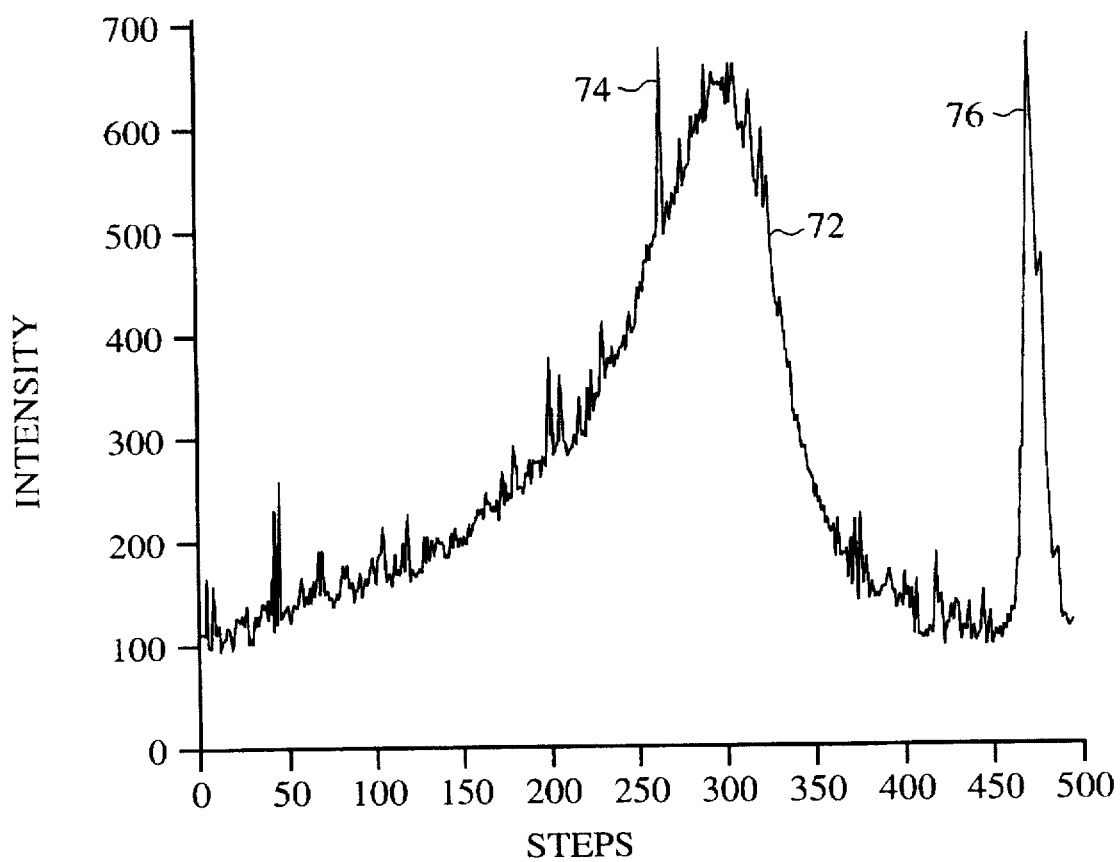
FIG. 4 is a graph of a back reflection signal obtained by using the method of FIG. 3.

As the focus-to-object positioning is varied, a signal is generated by the internal power sensor 18. The step 70 of forming a reflection-responsive signal is shown in FIG. 3. A graph 72 of an exemplary signal is shown in FIG. 4. The signal 72 measures the intensity of back reflection as a function of focus steps taken by the focusing element 32 of FIG. 1. Spike 74 is a consequence of noise, while spike 76 is generated as the output beam is returned to its original position and necessarily passes through the best focus again.

In its simplest embodiment, the peak of the reflection-responsive signal 72 of FIG. 4 is used to define the best focus for positioning substrate 30. However, signal noise may result in an incorrect calculation of the best focus. For example, noise spike 74 may be incorrectly identified as corresponding to the optimal step position. Consequently, the determination of best focus preferably includes either or both of optical filtering and electrical filtering.

In one embodiment, the difference between the intensity of beam reflection over a reflective target versus intensity when the beam is not over a target is calculated. This is shown at step 78 in FIG. 3. The step may be carried out by providing prior identification of the position of the reflected target and differencing a sample known to be on-target from a sample known to be off-target. Alternatively, many intensity samples may be acquired for each sweep, with the samples being low-pass filtered and with the difference between the minimum and the maximum being calculated. The maximum back reflected energy will always be from a point over the reflective target, and the minimum will always be over a point off-target. This second technique does not require precise knowledge of the position of the reflective target, and is therefore relatively insensitive to alignment and manufacturing tolerances in the scanned surface. In fact, only very limited prior knowledge of the target position is required, since the technique accommodates an initial step of detecting the target position.

Step 78 is carried out at the detector circuit 22 of FIG. 1. A difference output is formed for each sweep of the beam, with the difference output being in correspondence with a known step position of the output beam 16. Preferably, the difference output data are low-pass filtered and phase delay is removed. This filtering and delay removal may be carried out using any of the known techniques. Finally, a global extreme may be identified. The global extreme would occur at approximately step 300 in FIG. 4. As an alternative to finding a global extreme, a local extreme detector may be utilized to examine the data of the previous low-pass filter process. By sliding a window "through" the data set, local minimum and/or maximum values of the data set may be determined for various positions of the window. If a minimum or maximum lies within the middle of the window, the position of the extreme is output to a list of local extrema. Each list item should identify the type of extremum it represents, the intensity, and the location. Optionally, the width of the locality of the extremum is also identified. Finally, the list of extrema is examined to identify a local minimum that is adjacent to one or more local maximum. If this condition is met, the location of the local minimum is selected as the point of focus. Otherwise, the focus point is considered to be beyond the travel of the focusing element and an error is reported. This alternative technique of identifying local extrema is more computation-intensive than the global extreme identification, which yields acceptable results.

Experience has shown that most reflection-based focusing techniques are somewhat sensitive to the alignment of the reflected beam to the detector. As the temperature of the optical system changes under normal operation, laser beam alignment changes. It has been discovered that these alignment changes can be calibrated to achieve improved performance of the present invention. While several algorithms may be used to provide enhanced performance, a linear model that is based on the measure of the symmetry of the peak of the focus data acquired using the steps of FIG. 3 provides the desired robustness. With regard to the low-pass filter focus data, let $i_{max}$ be the index of the global maximum of the filtered data and $v_{max}$ be the intensity value at the global maximum. Also, let $i_{hm1}$ be the nearest index less than $i_{max}$ at which the filtered data crosses $(V_{max}-V_{min})/2$, and let $i_{hm2}$ be the corresponding index greater than $i_{max}$. The skew is then defined as: skew=$i_{max}-(i_{hm1}+i_{hm2})/2$.

A linear model based on the skew measurement can then be formed, with offset=a×skew +b, where parameters a and b are derived by empirical measurements of focus error, e.g., by comparing focus position using a CCD camera and a pellicle beam splitter. For this purpose, the CCD camera is positioned such that its sensor is the same optical path length from the focus beam as the nominal beam waist position of the laser.

As shown in FIG. 1, the mount 40 or the substrate 30 is connected to three motors 82, 83 and 84. In order to achieve a focusing plane across the surface of the substrate, separate motors are often included in an imaging system for fluorescently tagged molecules. Motor 82 may be connected to adjust the roll of the substrate, motor 83 may adjust substrate pitch, and motor 84 may be connected to move the substrate forwardly and rearwardly. The position of the substrate relative to the output beam can be adjusted, so that the focus is maintained through an entire sweep and so that refocusing is not required each time that the substrate is incremented. Again referring to FIG. 2, multiple reflective targets 54, 56, 58 and 59 are utilized in order to facilitate multiple focusing operations. FIG. 3 shows a step 86 of repeating the focusing operation on a target-by-target basis.

We claim:

1. A method of operating a laser device having an integral power-regulation sensor fixed to said laser device to be responsive to output beam power, said method comprising steps of:

directing an output beam from said laser device at an object of interest;

using said integral power-regulation sensor to detect energy reflected from said object of interest;

forming a signal indicative of said detected reflected energy; and based upon said signal, determining a characteristic related to said object of interest.

2. The method of claim 1 further comprising a step of changing polarization of said detected reflected energy relative to said output beam such that interaction between said output beam and said reflected energy is reduced.

3. The method of claim 2 wherein said step of changing polarization of said detected reflected energy includes positioning a quarter-wave plate in a beam path from said laser device to said object of interest.

4. The method of claim 1 wherein said step of determining a characteristic related to said object of interest is a step of determining focus of said output beam on a surface of said object of interest, said method further comprising defining relative positioning of said focus and said surface based upon said step of determining focus of said output beam on said surface.

5. The method of claim 4 further comprising locating reflective targets on said surface to increase said level of detected reflected energy when said output beam impinges one of said reflective targets.

6. The method of claim 4 further comprising a step of scanning said output beam along said surface, said step of defining said relative positioning includes positioning said surface such that said surface is substantially coplanar with a focal plane defined by said scanning output beam.

7. The method of claim 1 wherein said step of directing said output beam at said object of interest includes positioning a chip having an array of fluorescently tagged biological samples.

8. The method of claim 7 wherein said step of directing said output beam further includes employing a gas laser device having said integral power-regulation sensor housed within said laser device.

9. The method of claim 1 further comprising a step of disabling said integral power-regulation sensor with respect to being responsive to said output beam output prior to said step of directing said output beam at said object of interest.

10. The method of claim 1 wherein said step of determining said characteristic based upon said signal includes filtering DC components from said signal, thereby reducing effects of variations in said output beam generated by said laser device.

11. A method of focusing an output beam emitted from a laser device having a housing that includes an integral power sensor to sample said output beam for dynamically controlling output beam power, said method comprising steps of:

disabling said integral power sensor with respect to dynamic control of said output beam power;

impinging a surface with said output beam;

varying relative positioning between a focus of said output beam and said surface;

during said step of varying said relative positioning, detecting a signal responsive to beam energy reflected at said surface and received at said integral power sensor; and selecting a focus of said output beam on said surface based upon said signal.

12. The method of claim 11 further comprising scanning said output beam relative to said surface.

13. The method of claim 12 further comprising steps of:

(a) systematically moving said surface in a direction perpendicular to a scanning direction; and (b) repeating said step of selecting a focus for a plurality of positions of said surface.

14. The method of claim 12 further comprising forming an array of highly reflective targets on said surface.

15. The method of claim 11 further comprising a step of providing rotation of beam polarization such that said received reflected beam polarization is rotated 90 degrees relative to beam polarization of said output beam emitted from said laser device.

16. A system for forming an image of a surface comprising:

a laser device having an internal power sensor positioned to receive a portion of an output beam prior to emergence from said laser device;

a chip mount for securing a substrate within a path of said output beam;

means for providing relative movement between said output beam and a substrate secured by said chip mount;

circuit means for determining intensity of energy back reflected from said substrate along said path, said circuit means being responsive to back reflected energy received at said internal sensor; and position means for positioning a focus of said output beam at a surface of said substrate, said position means being responsive to said circuit means.

17. The system of claim 16 wherein said position means is connected to vary either a position of said substrate or a focus element for focusing said output beam.

18. The system of claim 16 wherein said system further comprises a means for scanning said output beam along said surface of said substrate.

19. The system of claim 16 further comprising a quarter-wave plate along said path of said output beam.

20. The system of claim 16 further comprising reflective targets on said surface of said substrate.

21. The system of claim 20 further comprising biological samples on said surface.

* * * * *